US009672913B1

(12) United States Patent
Joo

(10) Patent No.: US 9,672,913 B1
(45) Date of Patent: Jun. 6, 2017

(54) SEMICONDUCTOR MEMORY DEVICE AND OPERATING METHOD THEREOF

(71) Applicant: SK hynix Inc., Icheon-si, Gyeonggi-do (KR)

(72) Inventor: Byoung In Joo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/201,868

(22) Filed: Jul. 5, 2016

(30) Foreign Application Priority Data

Feb. 19, 2016 (KR) ........................ 10-2016-0019791

(51) Int. Cl.
*G11C 15/00* (2006.01)
*G11C 15/04* (2006.01)
*G11C 7/00* (2006.01)

(52) U.S. Cl.
CPC .............. *G11C 15/046* (2013.01); *G11C 7/00* (2013.01)

(58) Field of Classification Search
USPC ........................................................ 365/49.1
See application file for complete search history.

(56) References Cited

U.S. PATENT DOCUMENTS

| 2004/0130953 A1* | 7/2004 | Ambroggi | G11C 29/82 365/200 |
| 2006/0209583 A1* | 9/2006 | Kawabata | G11C 15/00 365/49.1 |
| 2013/0198445 A1* | 8/2013 | Bando | G11C 15/04 711/108 |

FOREIGN PATENT DOCUMENTS

KR  1020100121827 A  11/2010
KR  1020150045642 A  4/2015

* cited by examiner

*Primary Examiner* — Son Dinh
*Assistant Examiner* — Uyen B Tran
(74) *Attorney, Agent, or Firm* — William Park & Associates Ltd.

(57) ABSTRACT

There are provided a semiconductor memory device and an operating method thereof. The method of operating a semiconductor memory device may include receiving an erase and write (E/W) cycle mode select command and an operation command. The method may include selecting one E/W cycle mode information among a plurality of E/W cycle mode information stored according to the E/W cycle mode select command and storing the selected one E/W cycle mode information. The method may include performing a general operation of a memory cell array according to the one E/W cycle mode information stored and the operation command.

20 Claims, 5 Drawing Sheets

SEMICONDUCTOR MEMORY DEVICE AND OPERATING METHOD THEREOF

CROSS-REFERENCE TO RELATED APPLICATION

The present application claims priority under 35 U.S.C. §119(a) to Korean patent application number 10-2016-0019791 filed on Feb. 19, 2016, in the Korean Intellectual Property Office, the entire disclosure of which is incorporated herein by reference.

BACKGROUND

1. Technical Field

An aspect of the present disclosure may generally relate to an electronic device, and more particularly, to a semiconductor memory device and an operating method thereof.

2. Related Art

Semiconductor devices, particularly, semiconductor memory devices are generally classified into volatile memory devices and nonvolatile memory devices.

A nonvolatile memory device performs a read/write operation at a relatively low speed. However, the nonvolatile memory device retains its' stored data even when a power supply is cut off. Accordingly, the nonvolatile memory device is used to store data to be retained regardless of a power supply. Examples of the nonvolatile memory devices are a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories are classified into NOR type flash memories and NAND type flash memories.

One benefit to using a flash memory is being able to freely program and erase the flash memory because of its' RAM. Also, flash memory has the advantage of implementing its' ROM in which stored data is retained even when a power supply is cut off. Thus, the flash memories are widely used as a storage medium for portable electronic devices such as a digital camera, a personal digital assistant (PDA), and an MP3 player.

SUMMARY

According to aspects of the present disclosure, there may be a semiconductor memory device and an operating method thereof. The method of operating a semiconductor memory device may include receiving an erase and write (E/W) cycle mode select command and an operation command. The method may include selecting one E/W cycle mode information among a plurality of E/W cycle mode information stored according to the E/W cycle mode select command and storing the selected one E/W cycle mode information. The method may include performing a general operation of a memory cell array according to the one E/W cycle mode information stored and the operation command.

DETAILED DESCRIPTION

Figure 1:
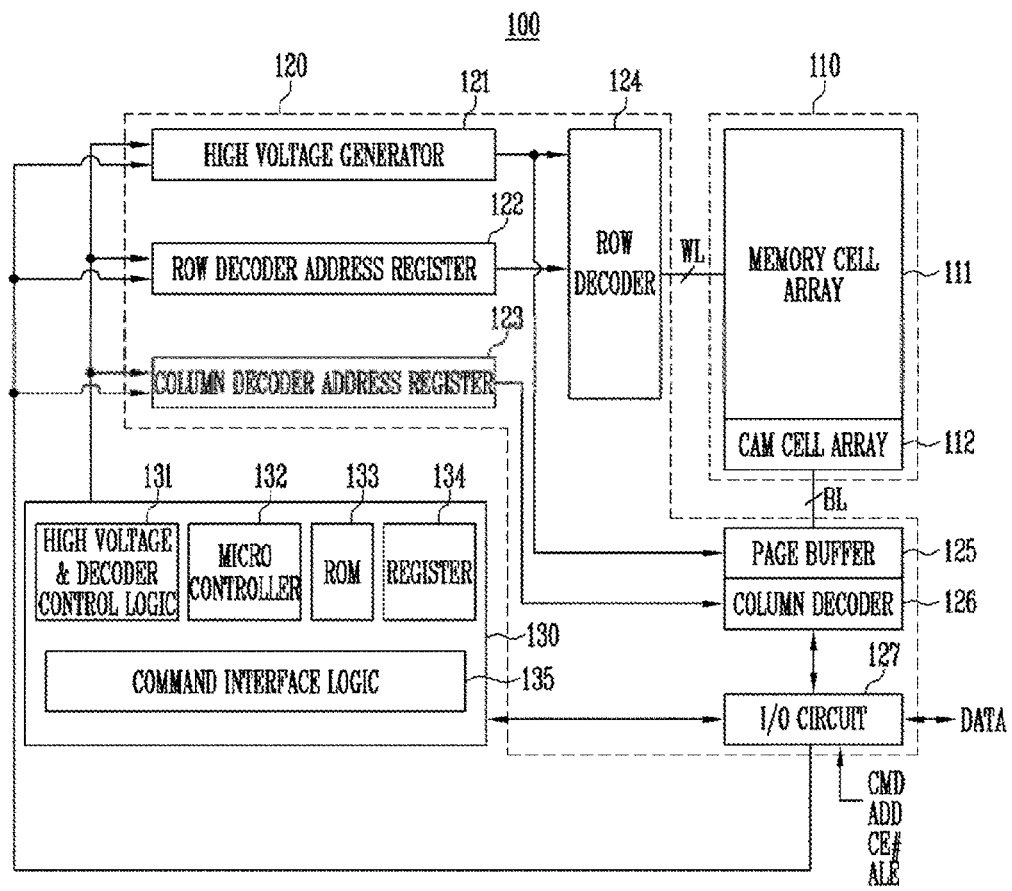
FIG. 1 is a block diagram illustrating a representation of an example of a semiconductor memory device according to an embodiment of the present disclosure.

In the following detailed description, only certain examples of embodiments of the present disclosure have been illustrated and described. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Embodiments may provide a semiconductor memory device and an operating method thereof, which can reduce the operation time of the semiconductor memory device.

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a block diagram illustrating a semiconductor memory device according to an embodiment of the present disclosure.

Referring to FIG. 1, the semiconductor memory device 100 includes a memory cell unit 110, a peripheral circuit 120, and a controller 130.

The memory cell unit 110 includes a memory cell array 111 and a content addressable memory (CAM) cell array 112.

Here, the memory cell array 111 and the CAM cell array 112 have the same structure and characteristics. The memory cell array 111 and the CAM cell array 112 include a plurality of memory cells. The plurality of memory cells are connected to a row decoder 124 through a plurality of word lines WL and connected to a page buffer 125 through a plurality of bit lines BL. As an embodiment, the plurality of memory cells included in the memory cell array 111 and the CAM cell array 112 may be configured as nonvolatile memory cells. For example, the plurality of memory cells may be charge trap device-based nonvolatile memory cells.

A plurality of memory cells included in the memory cell array 111 may store program data.

A plurality of memory cells included in the CAM cell array 112 may store option information on the semiconductor memory device 100. For example, the plurality of memory cells included in the CAM cell array 112 may store erase and write (erase/write) (E/W) cycle mode information.

In addition to the CAM cell array 112, a storage unit is additionally disposed in the semiconductor memory device 100 to store a plurality of E/W cycle mode information.

The peripheral circuit 120 includes a high voltage generator 121, a row decoder address register 122, a column decoder address register 123, the row decoder 124, the page buffer 125, a column decoder 126, and an input and output (input/output) (I/O) circuit 127.

The high voltage generator 121, in a general operation of the memory cell array 111, generates a plurality of operation voltages under control of the controller 130 and supplies the generated operation voltages to the row decoder 124, the page buffer 125, and the like.

The row decoder address register 122 stores a row address signal among address signals received through the input/output circuit 127, and transmits the stored row address signal to the row decoder 124.

The column decoder address register 123 stores a column address signal among the address signals received through the input/output circuit 127, and transmits the stored column address signal to the column decoder 126.

The row decoder 124 selectively applies the plurality of operation voltages generated by the high voltage generator 121 to the plurality of word lines WL in response to the row address signal.

The page buffer 125 is connected to the memory cell unit 110 through the plurality of bit lines BL. The page buffer 125, in a program operation, arbitrarily stores program data input from the outside and then adjusts potential levels of the plurality of bit lines BL according to the arbitrarily stored data. The page buffer 125, in a read operation, reads data stored in the memory cell unit 110 and outputs the read data to the outside.

Also, the page buffer 125, in the program operation, reads E/W cycle mode information stored in the CAM cell array 112 and outputs the read E/W cycle mode information to the controller 130.

The column decoder 126 transmits program data to the page buffer 125 through a selected column among a plurality of columns in response to the column address signal, or receives data read through the page buffer 125.

The input/output circuit 127 receives together an operation command for the general operation of the memory cell array 111 and an E/W cycle mode select command for selecting one E/W cycle mode information among the plurality of E/W cycle mode information stored in the CAM cell array 112, and transmits the received commands to the controller 130. Also, the input/output circuit 127 receives program data and address signals in the program operation, and receives data read in the read operation, to output the received data and signals to the outside.

The controller 130 includes a high voltage and decoder control logic 131, a microcontroller 132, a read only memory (ROM) 133, a register 134, and a command interface logic 135.

The high voltage and decoder control logic 131 controls the high voltage generator 121 to generate a plurality of operation voltages such as a program voltage and a read voltage in the program and read operations. The high voltage and decoder control logic 131 controls the row decoder 124 to apply the plurality of operation voltages generated by the high voltage generator 121 to the memory cell unit 110. The high voltage and decoder control logic 131 controls the column decoder 126 to perform a data transmission operation through a selected column among the plurality of columns in the program and read operations.

The microcontroller 132 outputs a control signal for controlling the memory cell unit 110 according to an operation command input from the command interface logic 135.

According to an embodiment of the present disclosure, the microcontroller 132 outputs control signals according to an E/W cycle mode select command and an operation command, which are input together from the command interface logic 135. The microcontroller 132 controls the high voltage and decoder control logic 131 to store, in the register 134, one E/W cycle mode information among the plurality of E/W cycle mode information stored in the CAM cell array 112 according to the E/W cycle mode select command and to perform the general operation of the memory cell array 111 according to the one E/W cycle mode information stored in the register 134 and the operation command input together with the E/W cycle mode select command.

When initial power is input to the semiconductor memory device 100, the ROM 133 stores an algorithm including a power-on reset operation, a read operation of the CAM cell array 112, a data recovery operation of the CAM cell array 112, etc., and stores option information required in an initial operation.

The register 134 may store data stored in the memory cell unit 110 according to a specific command. Referring to FIG. 1, it is illustrated that the register 134 is included in the controller 130, but the register 134 may be disposed outside of the controller 130.

For example, the register 134 may store one E/W cycle mode information among the plurality of E/W cycle mode information stored in the CAM cell array 112 according to the E/W cycle mode select command.

The command interface logic 135 receives a chip enable signal CE#, a command latch enable signal CLE, an address latch enable signal ALE, a write enable signal WE#, a read enable signal RE#, a ready/busy signal RB#, and the operation command for the general operation of the memory cell array 111 and the E/W cycle mode select command. The chip enable signal CE#, the command latch enable signal CLE, the address latch enable signal ALE, the write enable signal WE#, the read enable signal RE#, the ready/busy signal RB#, and the operation command are received by the command interface logic 135 from the input/output circuit 127. The command interface logic 135 transmits the chip enable signal CE#, the command latch enable signal CLE, the address latch enable signal ALE, the write enable signal WE#, the read enable signal RE#, the ready/busy signal RB#, and the operation command to the microcontroller 132. The input/output circuit 127 may receive a command signal CMD, data DATA, address signals ADD, the chip enable signal CE#, the command latch enable signal CLE, the address latch enable signal ALE, the write enable signal WE#, the read enable signal RE#, the ready/busy signal RB#, and the operation command from outside the peripheral circuit 120, and in some embodiments from outside the semiconductor memory device 100. In an embodiment, the E/W cycle mode select command is generated by the command interface logic 135 in response to an output from the I/O controller 127 based on one or more of the following signals received by the I/O circuit 127: the command signal CMD, data DATA, address signals ADD, the chip enable signal CE#, the command latch enable signal CLE, the address latch enable signal ALE, the write enable signal WE#, the read enable signal RE#, the ready/busy signal RB#, and the operation command. In an embodiment, the E/W cycle mode select command is received by the I/O circuit 127 and inputted to the command interface logic 135 by the I/O circuit 127. In an embodiment, the operation command is received by the I/O circuit 127 and inputted to the command interface logic 135 by the I/O circuit 127.

Figure 2:
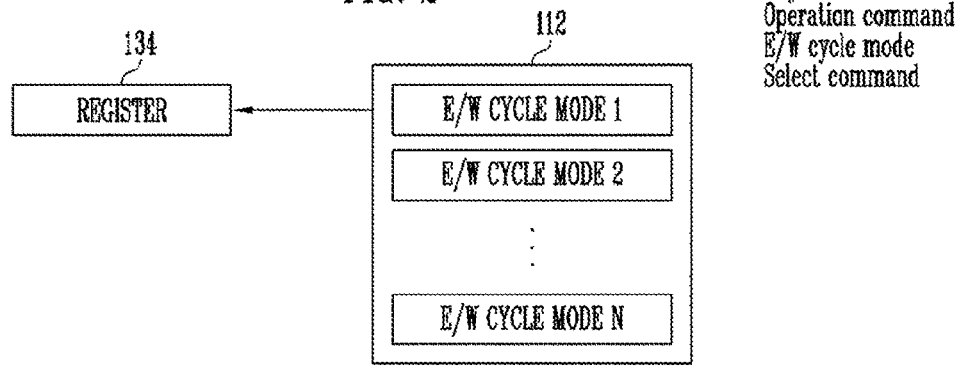
FIG. 2 is a block diagram illustrating a representation of an example of an operation between a content addressable memory (CAM) cell array and a register of a controller in FIG. 1.

FIG. 2 is a block diagram illustrating a representation of an example of an operation between the CAM cell array and the register of the controller in FIG. 1.

Referring to FIGS. 1 and 2, the CAM cell array 112 may store a plurality of E/W cycle mode information E/W cycle mode 1 to E/W cycle mode N (wherein N may be a natural number). Each of the plurality of E/W cycle mode information may include a set E/W cycle threshold value. If an E/W cycle mode select command is input, the controller 130 controls the page buffer 125 to selectively read one E/W cycle mode information among the plurality of E/W cycle mode information stored in the CAM cell array 112. The one E/W cycle mode information read by the page buffer 125 is stored in the register 134 through the column decoder 126 and the input/output circuit 127.

The register 134 may store one E/W cycle mode information. For example, when a new E/W cycle mode select command is input, one new E/W cycle mode information among the plurality of E/W cycle mode information stored in the CAM cell array 112 may be selected to be stored in the register 134. That is, the one E/W cycle mode information that has been stored in the register 134 may be updated with the new E/W cycle mode information.

Figure 3:
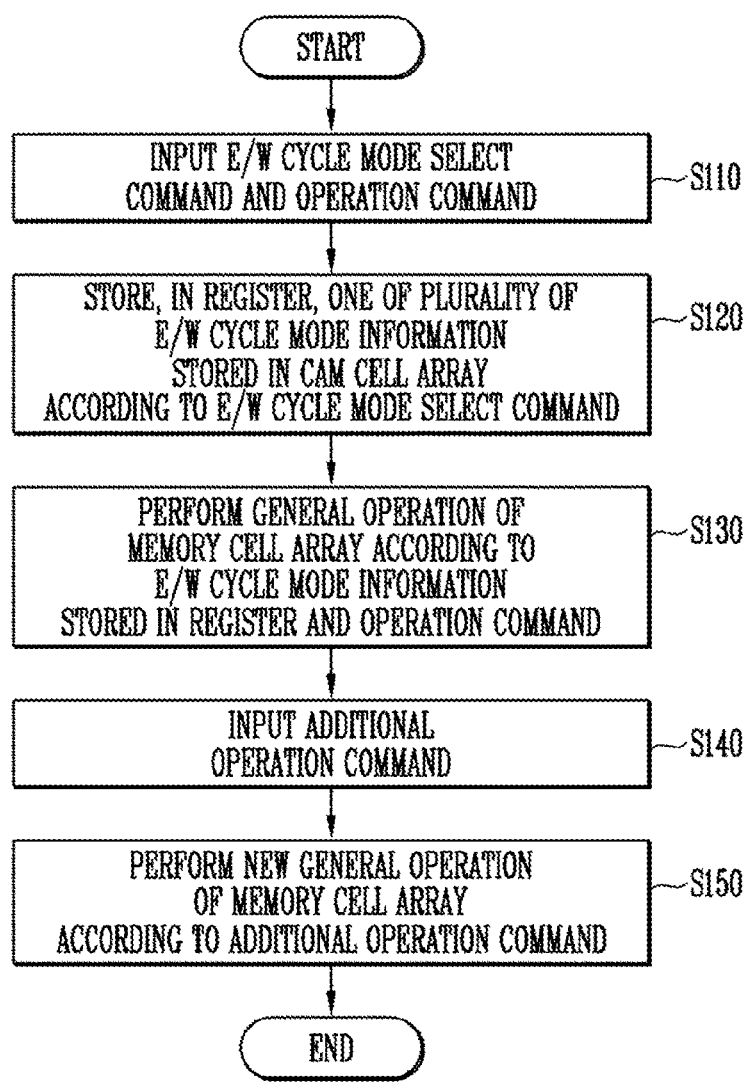
FIG. 3 is a flowchart illustrating a representation of an example of a sequence of operations of a semiconductor memory device according to an embodiment of the present disclosure.

FIG. 3 is a flowchart illustrating a representation of an example of a sequence of operations of a semiconductor memory device according to an embodiment of the present disclosure.

Referring to FIGS. 1 to 3, an E/W cycle mode select command and an operation command are input from the outside to the semiconductor memory device 100 (S110). In this case, the E/W cycle mode select command and the operation command may be input together. The E/W cycle mode select command is a command for selecting one E/W cycle mode information among a plurality of E/W cycle mode information stored in the CAM cell array 112 of the memory cell unit 110. The operation command is a command for performing a general operation, e.g., a program or read operation on the memory cell unit 110. The E/W cycle mode select command and the operation command are input from the outside to the controller 130 through the input/output circuit 127.

After the operation of step S110, the controller 130 selects one E/W cycle mode information among the plurality of E/W cycle mode information stored in the CAM cell array 112 according to the input E/W cycle mode select command and stores the selected E/W cycle mode information in the register 134 (S120).

After the operation of step S120, a general operation of the memory cell array 111 is performed according to the E/W cycle mode information stored in the register 134 and the operation command (S130). Referring to step S130, after one E/W cycle mode information is stored in the register 134, the general operation of the memory cell array 111 is successively performed.

For example, after one E/W cycle mode information is stored in the register 134, a discharge operation and bias setup may be omitted, in which the semiconductor memory device 100 again receives the operation command and performs the general operation of the memory cell array 111.

After the operation of step S130, an additional operation command is additionally input from the outside (S140), and a new general operation of the memory cell array 111 is performed according to the additional operation command (S150). The sum of numbers of times of inputting the operation command and the additional operation command corresponds to an E/W cycle threshold value included in the one E/W cycle mode information stored in the register 134. The E/W cycle threshold value may be changed depending on settings. If the sum of numbers of times of inputting the operation command and the additional operation command reaches the E/W cycle threshold value, the general operation of the memory cell array 111, which has been successively performed according to the operation command and the additional operation command, is ended.

If the general operation of the memory cell array 111 is ended, a hard reset command may be input from the outside to the semiconductor memory device 100, and a new E/W cycle mode select command may be input together with a new operation command from the outside. When the new E/W cycle mode select command is input, one new E/W cycle mode information among the plurality of E/W cycle mode information stored in the CAM cell array 112 may be stored in the register 134. That is, the one E/W cycle mode information that has been stored in the register 134 may be updated with the new E/W cycle mode information.

After that, a new general operation of the memory cell array 111 is performed according to the new E/W cycle mode information stored in the register 134 and the new operation command. Subsequent operations are identical or substantially identical to those described above, and therefore, their descriptions will be omitted.

Figure 4:
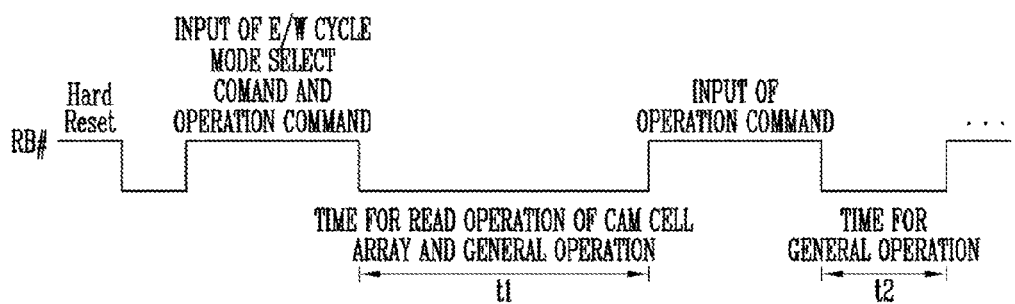
FIG. 4 is a diagram illustrating a representation of an example of a ready/busy signal while the operation of a semiconductor memory device is being performed according to an embodiment of the present disclosure.

FIG. 4 is a diagram illustrating a representation of an example of a ready/busy signal while the operation of a semiconductor memory device is being performed according to an embodiment of the present disclosure.

Referring to FIGS. 3 and 4, after a hard reset command is input from the outside to the semiconductor memory device 100, the semiconductor memory device 100 maintains a busy state. If an E/W cycle mode select command and an operation command are input together from the outside, the memory cell unit 110 maintains the busy state for a time t1. After a read operation in which one new E/W cycle mode information among the plurality of E/W cycle mode information stored in the CAM cell array 112 is stored in the register 134 is performed for the time t1, a general operation of the memory cell array 111 is successively performed. If the busy state for the time t1, an additional operation command is input from the outside to the semiconductor memory device 100. After that, the general operation of the memory cell array 111 is performed for a time t2 according to the additional operation command and the E/W cycle mode information stored in the register 134. At this time, the memory cell unit 110 maintains the busy state. After that, a plurality of additional operation commands may be successively input from the outside to the semiconductor memory device 100. The general operation of the memory cell array 111 is successively performed according to the plurality of additional operation commands. The sum of numbers of times of inputting the operation command and the additional operation commands corresponds to an E/W cycle threshold value included in the one E/W cycle mode information stored in the register 134. The E/W cycle threshold value may be changed depending on settings. If the sum of numbers of times of inputting the operation command and the additional operation commands reaches the E/W cycle threshold value, the general operation of the memory cell array 111, which has been successively performed according to the operation command and the additional operation commands, is ended.

If the general operation of the memory cell array 111 is ended, the hard reset command may be again input to the semiconductor memory device 100, and a new E/W cycle mode select command may be input together with a new operation command from the outside. When the new E/W cycle mode select command is input, one new E/W cycle mode information among the plurality of E/W cycle mode information stored in the CAM cell array 112 may be stored in the register 134. That is, the one E/W cycle mode information that has been stored in the register 134 may be updated with the new E/W cycle mode information.

After that, a new general operation of the memory cell array 111 is performed according to the new E/W cycle mode information and the new operation command. Subsequent operations are identical to those described above, and therefore, their descriptions will be omitted.

As described above, according to an embodiment of the present disclosure, the E/W cycle mode select command and the operation command can be input together to the semiconductor memory device 100. One E/W cycle mode information is stored in the register 134 according to the E/W cycle mode select command, so that it is possible to reduce the capacity of the register 134. In addition, after one E/W cycle mode information is stored in the register 134, a plurality of general operations of the memory cell array 111 are performed according to successively input operation commands, so that it is possible to reduce the operation time of the semiconductor memory device 100.

Figure 5:
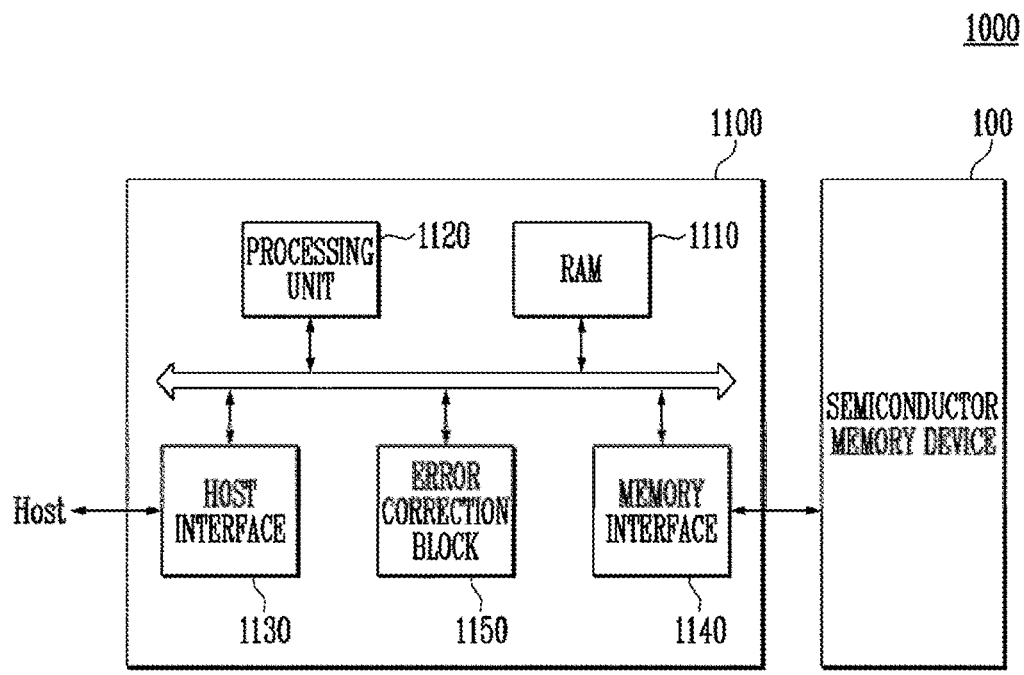
FIG. 5 is a block diagram illustrating a representation of an example of a memory system including a semiconductor memory device of FIG. 1.

FIG. 5 is a block diagram illustrating a representation of an example of a memory system including a semiconductor memory device of FIG. 1.

Referring to FIG. 5, the memory system 1000 includes a semiconductor memory device 100 and a controller 1100.

The semiconductor memory device 100 is identical to the semiconductor memory device described with reference to FIG. 1. Hereinafter, overlapping descriptions will be omitted.

The controller 1100 is connected to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the general operations of the controller 1100. Also, the controller 1100 may arbitrarily store program data provided from the host Host in a write operation.

The host interface 1130 includes a protocol for exchanging data between the host Host and the controller 1100. For an example of an embodiment, the controller 1100 may be configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correction block 1150 is configured to detect and correct an error of data received from the semiconductor memory device 100 by using an error correction code (ECC). The processing unit 1120 may control the semiconductor memory device 100 to adjust a read voltage, based on an error detection result of the error correction block 1150, and to perform re-reading. For an example of an embodiment, the error correction block 1150 may be provided as a component of the controller 1100.

The controller 1100 and the semiconductor memory device 100 may be integrated into one semiconductor device. For an example of an embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host connected to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

For an example of an embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 6:
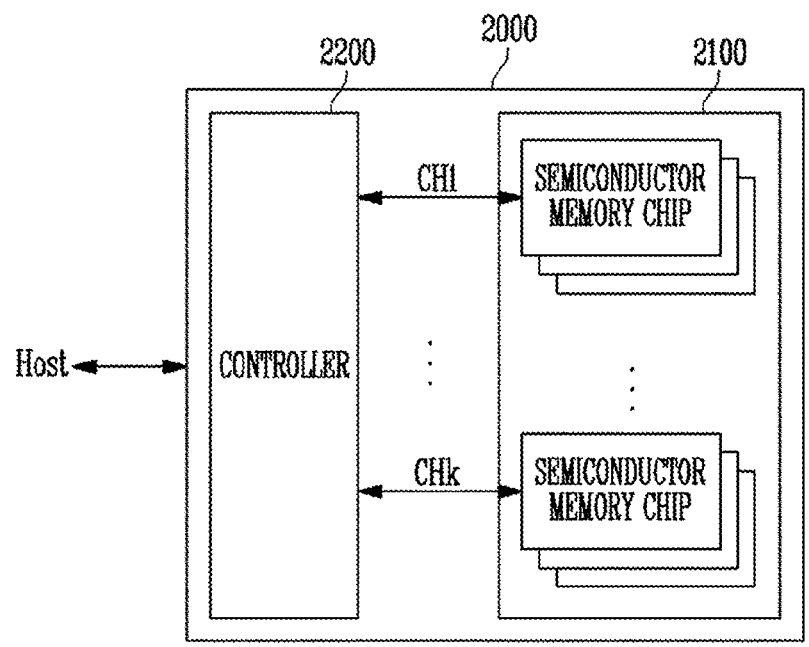
FIG. 6 is a block diagram illustrating a representation of an example of an application example of a memory system of FIG. 5.

FIG. 6 is a block diagram illustrating a representation of an example of an application example of a memory system of FIG. 5.

Referring to FIG. 6, the memory system 2000 includes a semiconductor memory device 2100 and a controller 2200. The semiconductor memory device 2100 includes a plurality of semiconductor memory chips. The plurality of semiconductor memory chips are divided into a plurality of groups.

Referring to FIG. 6, it is illustrated that the plurality of groups communicate with the controller 2200 through first to kth channels CH1 to CHk (wherein K may be a natural number).

Each group is configured to communicate with the controller 2200 through one common channel. The controller 2200 is configured similarly to the controller 1100 described with reference to FIG. 5. The controller 2200 is configured to control the plurality of memory chips of the semiconductor memory device 2100 through the plurality of channels CH1 to CHk. The semiconductor memory device 2100 may be realized with or include the semiconductor memory device 100 described with reference to FIG. 1.

Figure 7:
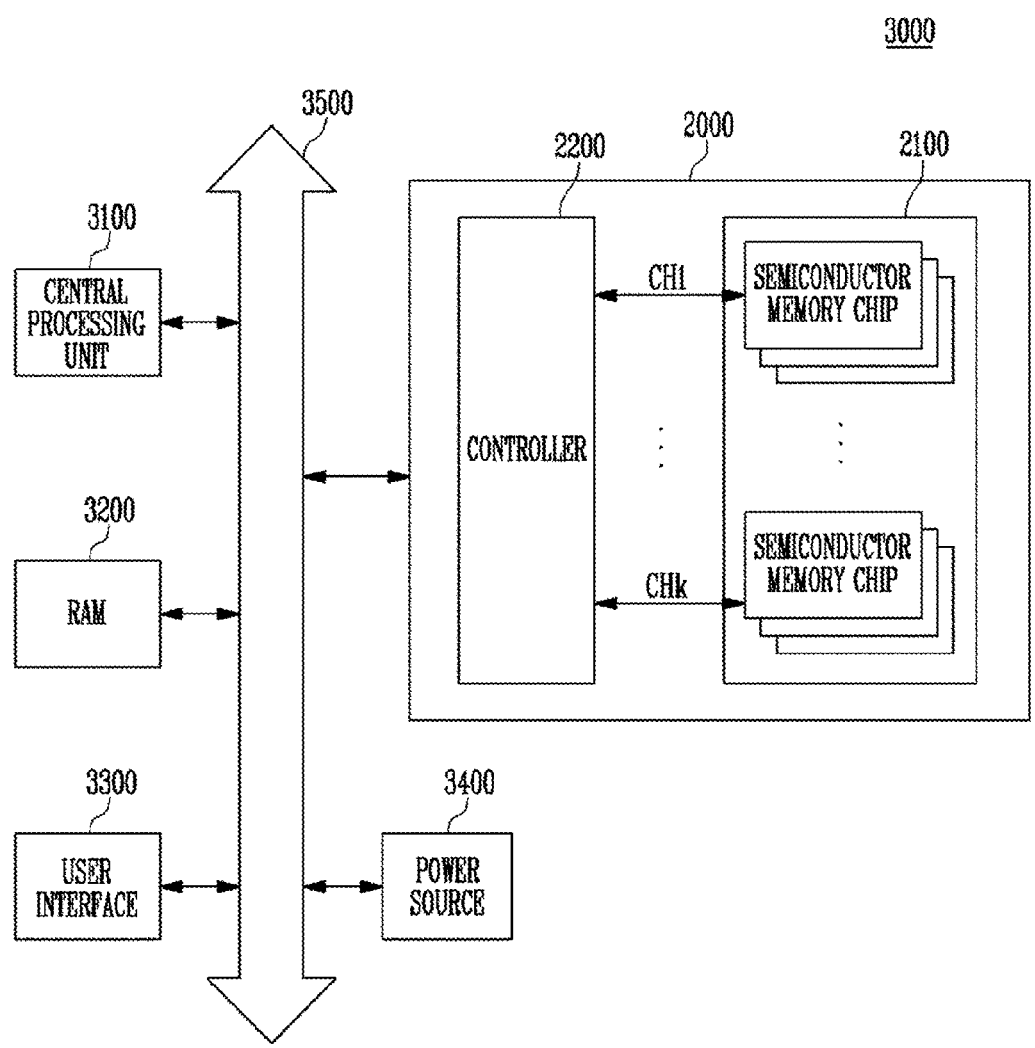
FIG. 7 is a block diagram illustrating a representation of an example of a computing system including a memory system described with reference to FIG. 6.

FIG. 7 is a block diagram illustrating a representation of an example of a computing system including a memory system described with reference to FIG. 6.

Referring to FIG. 7, the computing system 3000 includes a central processing unit 3100, a RAM 3200, a user interface 3300, a power source 3400, a system bus 3500, and a memory system 2000.

The memory system 2000 is electrically connected to the central processing unit 3100, the RAM 3200, the user interface 3300, and the power source 3400 through the system bus 3500. Data supplied through user interface 3300 or data processed by the central processing unit 3100 are stored in the memory system 2000.

Referring to FIG. 7, it is illustrated that the semiconductor memory device 2100 is connected to the system bus 3500 through the controller 2200. However, the semiconductor memory device 2100 may be directly connected to the system bus 3500. In this case, the function of the controller 2200 may be performed by the central processing unit 3100 and the RAM 3200.

Referring to FIG. 7, it is illustrated that the memory system 2000 described with reference to FIG. 6 is provided. However, the memory system 2000 may be replaced by the memory system 1000 described with reference to FIG. 5. For an example of an embodiment, the computing system 3000 may be configured to include both the memory systems 1000 and 2000 described with reference to FIGS. 5 and 6. The semiconductor memory device 2100 may be realized with or include the semiconductor memory device 100 described with reference to FIG. 1.

According to the present disclosure, only one E/W cycle mode information among a plurality of E/W cycle mode information stored in the CAM cell array is selectively stored in the register according to the E/W cycle mode select command, so that it is possible to reduce the capacity of the register. In addition, after one E/W cycle mode information is stored in the register, a general operation of the memory cell array is performed according to a plurality of operation commands, so that it is possible to reduce the operation time of the semiconductor memory device.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a semiconductor memory device, the method comprising:
   receiving, with a peripheral circuit, an erase and write (E/W) cycle mode select command and an operation command, the peripheral circuit coupled to a memory cell unit including a memory cell array and a content addressable memory (CAM) cell array;
   receiving, with a controller, the E/W cycle mode select command and the operation command from the peripheral circuit;
   selecting, with the controller, one E/W cycle mode information among a plurality of E/W cycle mode information stored in the CAM cell array according to the E/W cycle mode select command and storing the selected one E/W cycle mode information in a register; and
   performing, with the peripheral circuit, a general operation of the memory cell array according to the one E/W cycle mode information stored in the register and the operation command.

2. The method of claim 1, further comprising, when an additional operation command is additionally received after the general operation is performed, performing a new general operation with the memory cell array according to the one E/W cycle mode information stored in the register and the additional operation command.

3. The method of claim 2, wherein a sum of numbers of times of inputting the operation command and the additional operation command is input to correspond to an E/W cycle threshold value included in the one E/W cycle mode information.

4. The method of claim 3, further comprising, if the sum of numbers of times of inputting the operation command and the additional operation command reaches the E/W cycle threshold value, inputting a hard reset command externally from the semiconductor memory device.

5. The method of claim 4, further comprising, after the hard reset command is received, receiving, with the peripheral circuit, a new E/W cycle mode select command externally from the semiconductor memory device.

6. The method of claim 5, further comprising, after the new E/W cycle mode select command is received, storing, in the register, one new E/W cycle mode information among the plurality of E/W cycle mode information stored in the CAM cell array according to the new E/W cycle mode select command.

7. A semiconductor memory device comprising:
a memory cell array;
a content addressable memory (CAM) cell array configured to store a plurality of erase and write (E/W) cycle mode information;
a peripheral circuit configured to perform a general operation with the memory cell array;
a register configured to store one E/W cycle mode information selected among the plurality of E/W cycle mode information stored in the CAM cell array; and
a controller configured to store, in the register, the one E/W cycle mode information among the plurality of E/W cycle mode information stored in the CAM cell array according to an E/W cycle mode select command received externally from the semiconductor memory device and then control the peripheral circuit to perform the general operation with the memory cell array according to the one E/W cycle mode information stored in the register and an operation command.

8. The semiconductor memory device of claim 7, wherein the controller controls the peripheral circuit according to the operation command input together with the E/W cycle mode select command.

9. The semiconductor memory device of claim 7, wherein, when an additional operation command is additionally input after the general operation of the memory cell array is performed, the controller controls the peripheral circuit to perform a new general operation of the memory cell array according to the one E/W cycle mode information stored in the register and the additional operation command.

10. The semiconductor memory device of claim 9, wherein the one E/W cycle mode information includes an E/W cycle threshold value, and, if the sum of numbers of times of inputting the operation command and the additional operation command reaches the E/W cycle threshold value, a hard reset command is input externally from the semiconductor memory device.

11. The semiconductor memory device of claim 10, wherein, after the hard reset command is input, a new operation command is input, together with a new E/W cycle mode select command, externally from the semiconductor memory device.

12. The semiconductor memory device of claim 11, wherein, if the new E/W cycle mode select command is input, the controller stores, in the register, one new E/W cycle mode information among the plurality of E/W cycle mode information stored in the CAM cell array according to the new E/W cycle mode select command.

13. A semiconductor memory device comprising:
a memory cell unit configured to include a memory cell array and a CAM cell array;
a peripheral circuit configured to perform a general operation of the memory cell array; and
a controller configured to store, in a register, one E/W cycle mode information among a plurality of E/W cycle mode information stored in the CAM cell array according to an E/W cycle mode select command input externally from the semiconductor memory device, and control the peripheral circuit to perform the general operation of the memory cell array according to the one E/W cycle mode information stored in the register and an operation command input together with the E/W cycle mode select command.

14. The semiconductor memory device of claim 13, wherein, after the one E/W cycle mode information is stored in the register, the controller controls the peripheral circuit to perform the general operation with the memory cell array.

15. The semiconductor memory device of claim 14, wherein, when an additional operation command is additionally input from the after the general operation of the memory cell array is performed, the controller controls the peripheral circuit to perform a new general operation of the memory cell array according to the one E/W cycle mode information and the additional operation command.

16. The semiconductor memory device of claim 15, wherein the one E/W cycle mode information includes an E/W cycle threshold value.

17. The semiconductor memory device of claim 16, wherein the sum of numbers of times of inputting the operation command and the additional operation command is less than or equal to the E/W cycle threshold value.

18. The semiconductor memory device of claim 17, wherein, if the sum of numbers of times of inputting the operation command and the additional operation command reaches the E/W cycle threshold value, a hard reset command is input externally from the semiconductor memory device.

19. The semiconductor memory device of claim 18, wherein, after the hard reset command is input, a new operation command is input together with a new E/W cycle mode select command externally from the semiconductor memory device.

20. The semiconductor memory device of claim 19, wherein, if the new E/W cycle mode select command is input, the controller stores, in the register, one new E/W cycle mode information among the plurality of E/W cycle mode information stored in the CAM cell array according to the new E/W cycle mode select command.

* * * * *